United States Patent [19]

Merki

[11] Patent Number: 4,641,525

[45] Date of Patent: Feb. 10, 1987

[54] METHOD AND APPARATUS FOR CHECKING THE WALL THICKNESS OF A LAYER

[75] Inventor: Hubert Merki, Brewster, N.Y.

[73] Assignee: Zumbach Electronic AG, Orpund, Switzerland

[21] Appl. No.: 743,298

[22] Filed: Jun. 10, 1985

[30] Foreign Application Priority Data

Jun. 18, 1984 [CH] Switzerland ............... 2939/84

[51] Int. Cl.$^4$ ............................................. G01B 7/10
[52] U.S. Cl. ................................. 73/432.1; 324/226; 324/230
[58] Field of Search ............... 73/432 R, 150 R, 601, 73/432.1; 324/229, 230, 231, 207, 226; 250/560

[56] References Cited

U.S. PATENT DOCUMENTS

| | | | |
|---|---|---|---|
| 3,693,075 | 9/1972 | Forster | 324/229 |
| 3,732,726 | 5/1973 | Ferber | 73/601 |
| 3,760,264 | 9/1973 | Zumbach | 324/320 |
| 4,395,119 | 7/1983 | Nakata et al. | 250/560 |

FOREIGN PATENT DOCUMENTS 710969  6/1965  Canada .................. 324/207

1212384 11/1970 United Kingdom ............... 73/150

*Primary Examiner*—Stewart J. Levy
*Assistant Examiner*—Robert R. Raevis

[57] ABSTRACT

In a method of checking the insulating sheath on a wire or cable leaving an extruder, the external diameter of the insulating sheath is continuously determined over the whole circumference by means of a first measuring apparatus and the wall thickness of the insulation is continuously detected over the whole circumference by means of a second measuring apparatus. The measured values are supplied to a computer which, inter alia, continuously determines the difference between the maximum and minimum wall thicknesses found ($W_{max} - W_{min}$). Eccentricity and minimum wall thickness of the sheath are calculated from this difference and from the measured external diameter of the insulation and the diameter of the conductor of the wire or cable, and are indicated in a display device. The measurement is thus rendered largely independent of fluctuations in sensitivity of the measuring apparatus for the wall thickness of the insulation. An apparatus for carrying out the method comprises the respective measuring apparatus and a computer for effecting the required calculations.

16 Claims, 7 Drawing Figures

METHOD AND APPARATUS FOR CHECKING THE WALL THICKNESS OF A LAYER

BACKGROUND OF THE INVENTION

The present invention relates to a method for checking the wall thickness of a layer, wherein the wall thickness is compared at various points of the layer by reference to the distance between a free surface of the layer and a reference member contiguous with an opposite surface of the layer to ascertain maxima and minima of the relative thickness values.

A known method of the above type is based on detecting maxima and minima of the wall thickness, storing them and indicating maximum and/or minimum values, and possibly also setting off an alarm if limiting values are exceeded. The wall-thickness measurement is effected by means of inductive transmitters. An absolute measurement is made difficult as a result of the dependence of the measurement on the temperature and other influences. It is true that it is known to remove the measuring head or heads periodically from the object to be measured, for example a cable or wire, in order to make a zero adjustment. This procedure is complicated, however, and in some circumstances, important measured values are lost during such adjustment.

It is also known to detect the layer thickness at four points each offset by 90° and to draw conclusions about the eccentricity from the measured values. It is further possible to determine the local layer thicknesses from the eccentricity as well as from the diameters of the layer and of the coated core from an angular function (U.S. Pat. No. 3,426,437). In this case, however, no gain in measuring accuracy is aimed at or achieved.

SUMMARY OF THE INVENTION

An object of the present invention is to achieve more accurate measured values for the wall thickness of the layer and for the eccentricity in an economic manner and without the loss of measured values.

The invention accordingly provides a method of checking the wall thickness of a layer, wherein the wall thickness is compared at various points of the layer by reference to the distance between a free surface of the layer and a reference member contiguous with the opposite surface layer, to ascertain maxima and minima of the relative thickness values, simultaneously at least one external dimension of a member embodying said layer is measured and data concerning at least one further quantity of said member is derived from the difference between the maxima and minima of the relative wall thicknesses and the said external dimension. Whereas the absolute values of the wall-thickness measurement are subject to the above-mentioned uncertainty as a result of varying measurement conditions, the differences between these measured values are not significantly influenced by variations in the measurement conditions, despite a certain non-linearity in the measuring function. Therefore, since only maxima and minima are detected as measured values, it is not absolutely necessary to take into consideration the position of these extreme values on the measured object.

When checking wires, for example, it is therefore possible to use a stationary measuring apparatus and to impart a regular twisting motion to the wires, which may be achieved either by the provision of appropriate means, or inherently as a result of a process to which the wire is to be subjected.

The invention also provides a measuring apparatus for carrying out the method of the invention in relation to a layer forming a surface coating on a generally cylindrical reference member comprising a measuring instrument for comparing the wall thickness of the surface coating, a measuring instrument for determining the external diameter of the surface coating, and a computer for calculating the eccentricity of the surface coating from the difference between measured maximum and minimum wall thickness values.

DETAILED DESCRIPTION OF PREFERRED EMBODIMENTS OF THE INVENTION

Figure 1:
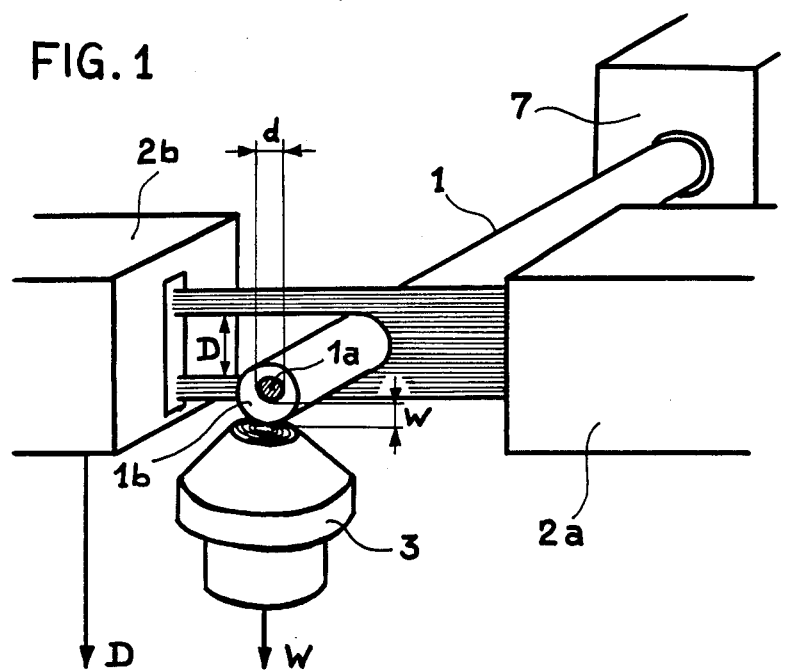
FIG. 1 is a diagrammatic perspective view illustrating measuring devices of an apparatus in accordance with the invention.

Referring to FIG. 1, there is illustrated a measuring apparatus checking the insulation of a wire or cable 1 with a conductor 1a and insulation 1b, the apparatus comprises a measuring instrument 2 with a transmitter section 2a and a receiver section 2b, for the optical measurement of external diameter D and the position of the wire 1 or its insulation 1b. Measuring instruments of this type are available and their measurement can be regarded as an absolute measurement. A second measuring instrument 3 serves to measure the wall thickness W of the insulation 1b. Instruments of this type, particularly instruments working inductively, which measure the distance to the conductor 1a of the wire 1 and hence the local insulation thickness, are also known. Their measurement must be regarded as "relative" because the measured value is dependent on external conditions, particularly the temperature as well as the diameter d of the conductor and its construction (stranded wire, cable). As mentioned, the object of the invention is to achieve a high independence of the measuring sensitivity of the wall-thickness measurement, by simple means. For the following examination, it is assumed that the diameter d of the conductor 1a is constant and known but in certain cases it may also be measured, as explained later.

Figure 2:
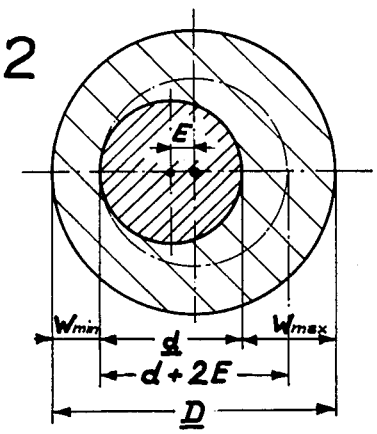
FIG. 2 is a section through an insulated wire or cable, the wall thickness of the insulation being greatly exaggerated for the purpose of clearer illustration.

As mentioned at the beginning, the aim is to relate all measurements to the difference $W_{max} - W_{min}$ between maxima and minima of the measured wall thickness. The various values hitherto mentioned can be seen from FIG. 2. The following relations result for the most useful calculable values, namely the minimum wall thickness $WB_{min}$ and the eccentricity E of the conductor in the insulation:

$$WB_{min} = \frac{D}{2} - \left(\frac{d}{2} + E\right) = \frac{D-d}{2} - E \quad (I)$$

$$E = \frac{W_{max} - W_{min}}{2} \quad (II)$$

if E from equation II is inserted I, $$WB_{min} = \frac{D-d}{2} - \frac{W_{max} - W_{min}}{2}$$

results.

Thus both the values of interest, but particularly the calculated minimum wall thickness $WB_{min}$, are no longer dependent on an "absolute measurement" of the wall thickness but only on a difference between the maxima and minima found. It is then only a question of bringing the magnitude of the difference $W_{max}-W_{min}$ into the correct relation with the "absolute" quantities D and d, for example by the selection of the amplification in the measuring channel of the measuring instrument 3. Thus, in comparison with the direct measurement of the wall thickness hitherto usual, the deviation of the calculated value from the actual value can be reduced by a factor of 20 for a wall-thickness difference of 10%.

Experience has shown that the external diameter D of wires and cables is subject to fluctuations. It may therefore be desirable to form an average value between extreme values $D_{max}$ and $D_{min}$ of D and also to correct the difference between the maxima and minima of the wall thickness, which leads to the following extended formulae:

$$E = \frac{W_{max} - W_{min} - \frac{D_{max} - D_{min}}{2}}{2}$$

$$WB_{min} = \frac{\frac{D_{max} + D_{min}}{2} - d}{2} - \left(\frac{W_{max} - W_{min}}{2} - \frac{D_{max} - D_{min}}{4}\right)$$

A microprocessor can be used for these calculations or those given above. In this case, the values are each detected and stored and subsequently processed during specific measuring periods or measured sections of specific length. A measuring installation working on the analogue system is also possible, however.

Some possible ways in which the desired maximum and minimum values are detected in practice are explained below.

Figure 3:
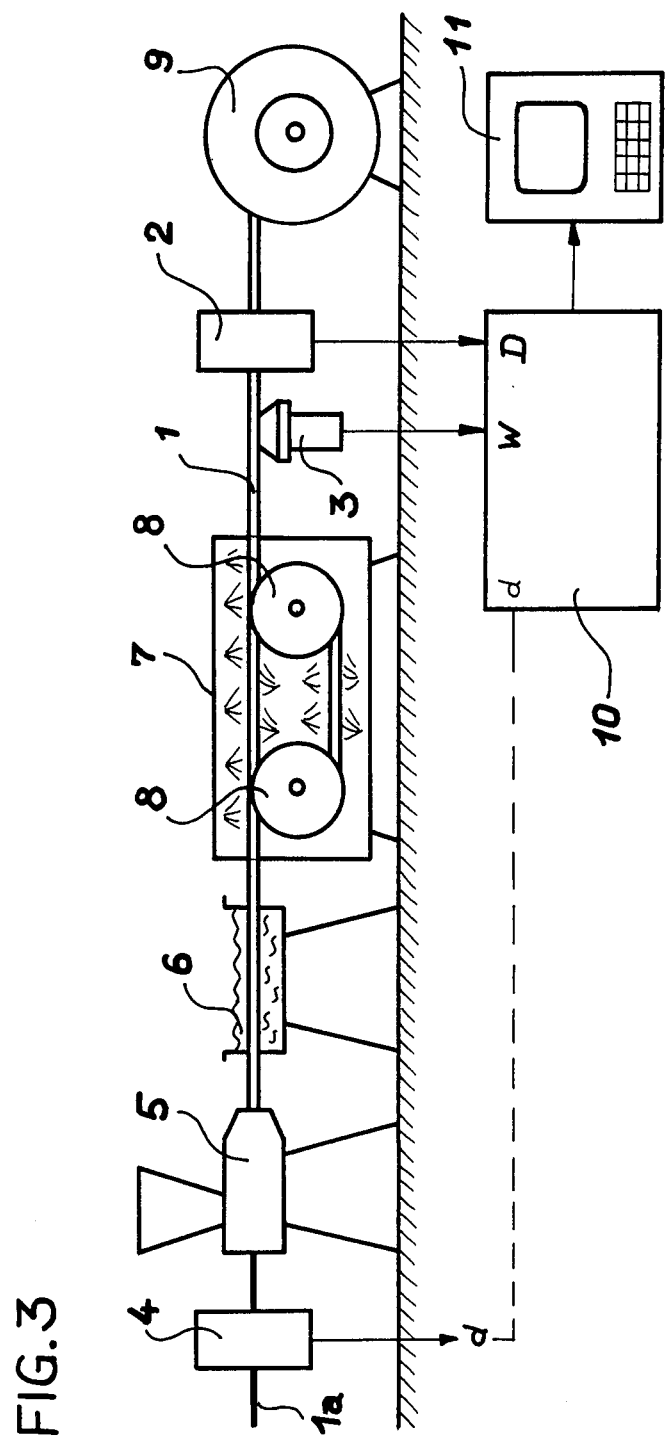
FIG. 3 is an elevation showing diagrammatically, the checking of an insulated wire in a production line including an apparatus in accordance with the invention.

FIG. 3 shows an installation for sheathing a wire 1a with an insulation sheath of plastics material. The incoming wire 1a, which may originate directly from a preceding drawing machine, first travels through a measuring device 4 to determine the diameter d of the wire. The bare wire then enters the extruder 5 in which it is covered with an insulation sheath of plastics material. The product then travels through a cooling bath 6 and then through a spray cooler 7 in which the wire 1 is repeatedly guided round rolls 8. The measuring apparatus then follows, with the thickness measuring instrument 3 and the measuring instrument 2 for the external diameter, after which the wire 1 is wound on a reel 9.

The values W and D found are supplied to a computer 10, the output of which is connected to a display device 11.

Experience has shown that the wire undergoes such a twisting in the spray cooler 7, in which it is repeatedly guided round the rolls 8, that sufficient twisting for measuring the wall thickness or the diameter at the whole circumference of the wire is achieved in the region of the measuring instruments 2 and 3. These values are processed in the computer 10 in accordance with the above formulae and the display 11 continuously shows, for example, the eccentricity in absolute or relative values and the minimum wall thickness. If a certain eccentricity is exceeded and/or there is drop below a certain wall thickness, an alarm may also be set off and/or a control may become effective to eliminate the fault which has appeared.

Figure 4:
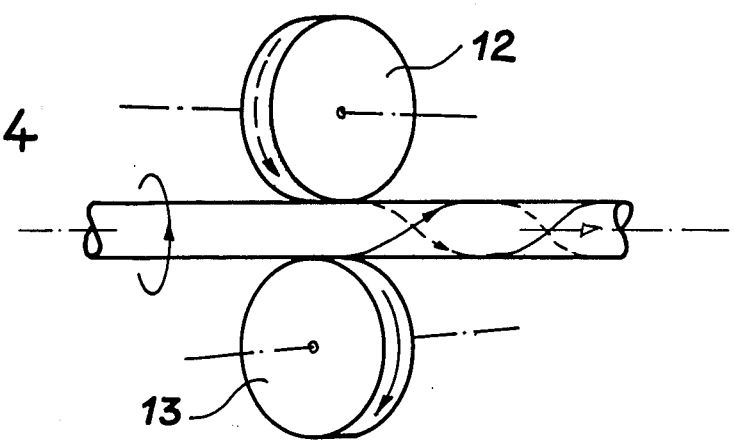
FIGS. 4 and 5 show diagrammatically in side view and in plan view, respectively, a twisting device for use in a measuring apparatus according to the present invention.
Figure 5:
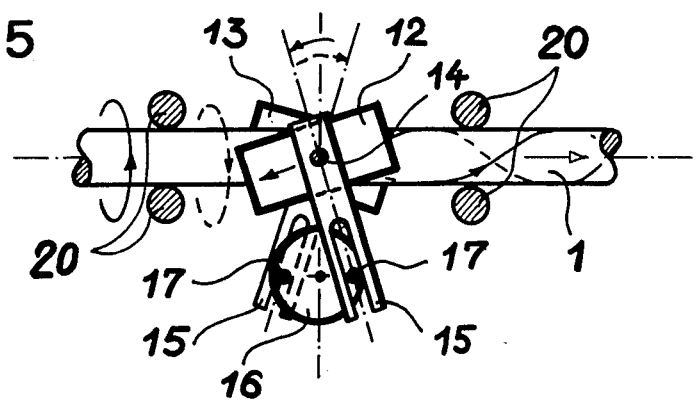

If the installation does not comprise a spray cooler 7 or if the twisting of the wire in this spray cooler is too unreliable or inadequate, a forced twisting of the cooler wire can be achieved. FIGS. 4 and 5 show diagrammatically, an auxiliary device for twisting the wire. The wire guided by means of bars 20 travels through between two rollers 12 and 13 which can be set obliquely, alternately in opposite directions with respect to the axis of the wire, as indicated in FIG. 5. As FIG. 5 also shows, the two rollers 12 and 13 are each mounted in a bearing bracket which can be pivoted about a vertical axis 14. Each bearing bracket comprises an arm 15 provided with a slot at the end. Associated with each of these arms is an upper and lower disc 16, which are disposed at the ends of a vertical shaft which can be driven. The upper disc comprises a pin 17 which projects freely upwards and the lower disc comprises a pin 17 which projects freely downwards and each of these pins engages in the slot in one of the arms 15. On the joint rotation of the discs 16, the arms 15 and hence the rollers 12 and 13 are pivoted backwards and forwards in push-pull and are therefore periodically inclined in the direction illustrated or in the opposite direction in relation to the axis of the wire. In the course of this, the wire travelling between the rollers 12 and 13 is alternately twisted in one direction or the other and travels through the measuring apparatus in the twisted state in such a manner that maxima and minima of the wall thickness are detected at the whole circumference.

With thicker wires or cables with which no automatic twisting is to be expected in the installation and no twisting or no adequate twisting could even be achieved with a device as shown in FIGS. 4 and 5, the measuring instruments 2 and 3 may be provided in a unit mounted so that it can execute at least one revolution round the cable. An apparatus is illustrated diagrammatically in FIG. 6 wherein the measuring instruments 2 and 3 are secured to a ring 18 which is mounted for rotation in a housing 19. Either the ring is reciprocated periodically through an angle of at least 360° in which case a direct electrical connection of the measuring instruments to the energy supply and the computer 10 is possible, or the ring 18 with the instruments 2 and 3 is uniformly driven in a certain direction, in which case the connections to the outside must be effected through slip rings or rotary transformers.

As already mentioned above, the instrument for measuring the diameter d of the conductor can be omitted if this diameter can be assumed to be constant and given, which is frequently the case. A fixed value for this diameter can then be fed into the computer.

Figure 6:
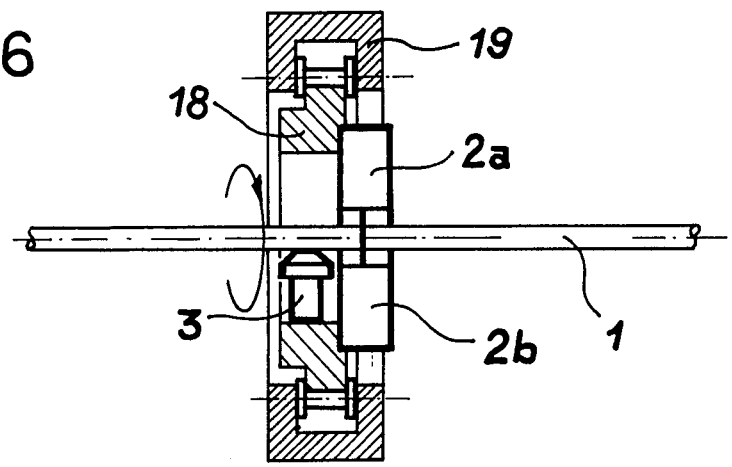
FIG. 6 is a sectional side elevation of a modified measuring device for an apparatus according to the invention.

It was pointed out above that variations in the external diameter D of the insulation in the longitudinal direction of the wire are detected and taken into consideration. Differences in diameter naturally also occur if the outer surface of the insulation is not strictly cylindrical but oval or elliptical. No fundamental errors result in this case, with regard to the measurement of the minimum wall thickness. If it is desired to be completely clear about the position of the conductor in the insulation, i.e. for permitting a correction of the eccentricity, a second measuring apparatus may be provided to determine the external diameter D in a direction at right angles to the the measuring direction shown in FIG. 1. In this case, the diameter would be measured simultaneously in the directions X and Y and all the quantities of interest could be determined with great accuracy from these values. In the case of a measurement with an apparatus as shown in FIG. 6, it is possible to supply the absolute position of the inner ring 18 and therefore also of the measuring instruments 2 and 3 to the computer 10 by means of a special transmitter. Such a procedure is only logical, however, if the cable travels through the measuring apparatus in a specific position, without being twisted.

A reference was made above to calibration of the measuring instrument 3 for detecting the wall thickness of the insulation. This calibration may be effected in such a manner that either a bare conductor or a precisely standardized wire or standardized cable is caused to approach the measuring apparatus 3, while all the time the position of the wire, conductor or cable and hence the distance from the measuring apparatus 3 are determined by means of the measuring instrument 2 and the measured value of the measuring apparatus 3. The calibration may be effected, for example by varying an amplification factor. In the case of digital processing of measured values by means of microprocessors, it is also possible to store measured values in sufficiently fine gradation during this calibration, in which case the non-linearity in the course of the measured values with regard to the distance is also taken into consideration and so a linearization of the measurement can be achieved which additionally increases the measuring accuracy (U.S. Pat. No. 4,181,961).

The invention is of particular importance in checking the insulation of insulated wires and cables which leave an extruder as explained above. Other applications are also possible, however. For example, the wall thickness of extruded tubes of plastics material could be determined by detecting the distance to a conducting member provided in the interior of the tube. It would also be conceivable however, to check other, non-round objects for the uniformity of an insulating layer.

If the analysis of the measured values is effected by means of microprocessors, special measures are possible to eliminate false measured values or not to take them into consideration in calculating the eccentricity and/or minimum wall thickness. This can be effected, on the one hand, by simply rejecting measured values which differ excessively from a mean value previously determined. A particular advantage of the combination of the two measuring instruments 2 and 3 also results from the fact that the measuring instrument 2 can be used to determine the relative position of the wire or cable 1 and of the measuring instrument 3.

Figure 7:
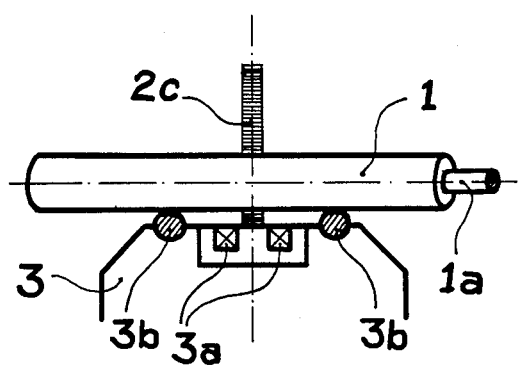
FIG. 7 is a side view of another modified measuring device, for an apparatus according to the invention.

As indicated in FIG. 7, the wire or cable 1 can be guided, at a defined distance from a measuring coil 3a of the measuring instrument 3, over sliding members 3b thereof, of wear-resistant material. Some of the beam of light 2c of the measuring instrument 2, which is indicated by a hatched rectangle in FIG. 7, passes between the wire or cable 1 and the top of the measuring instrument 3. The measuring instrument 2 can be designed so that it detects both the diameter D of the wire or cable and the distance between this and the measuring instrument 3. Should the wire or cable 1 be lifted from the sliding members 3b, resulting erroneous measurements can be eliminated or the measured distance can be appropriately corrected.

I claim:

1. A method of checking the wall thickness of a layer wherein the wall thickness is measured at various points of the layer by determining the distance of a coated inner part from the accessible outer surface of the layer, to ascertain maxima and minima of the measured distance values, whereby in addition to said maxima and minima of the wall thickness, at least maxima and minima of one external dimension of a member embodying said layer, this external dimension being simultaneously measured, and data relating to at least one further quantity is derived from the difference between said maxima and minima of the wall thickness and the difference between said maxima and minima of the external dimension, for minimizing the effect of drift and non linearity upon said measured wall thickness values and said external dimension values.

2. A method as claimed in claim 1, wherein in one and the same measuring operation, both said external dimension and the position of an instrument measuring said wall thickness relatively to the outer surface of the layer are determined.

3. A method as claimed in claim 1, wherein said layer comprises a surface coating upon a substantially cylindrical member forming said coated inner part, said external dimension is the diameter of the external surface of the coating, and said further derived quantity is the eccentricity of said coated inner part in said coating.

4. A method as claimed in claim 3, wherein a predetermined or measured value of the diameter of said cylindrical member is utilized together with the difference between said maxima and minima of the wall thickness value and the diameter of said external surface to determine the minimum wall thickness of the coating.

5. A method as claimed in claim 4, wherein said cylindrical member comprises a conductor of an electrical cable or wire and said surface coating comprises an electrically insulating sheath.

6. A method as claimed in claim 5, wherein the external diameter of said coating is determined successively at various positions of the cylindrical member, and a mean value between ascertained maxima and minima is formed.

7. A method as claimed in claim 6, wherein the eccentricity E is determined from maxima and minima of the wall thickness ($W_{max}$, $W_{min}$) and the external diameter ($D_{max}$, $D_{min}$) in accordance with the formula $$E = \frac{(W_{max} - W_{min}) - \frac{(D_{max} - D_{min})}{2}}{2}$$

8. A method as claimed in claim 6, wherein a minimum wall thickness $WB_{min}$ is calculated from maxima and minima of the external diameter ($D_{max}$, $D_{min}$), the diameter d of the conductor and the difference found between the measured wall thickness ($W_{max} - W_{min}$) in accordance with the following formula:

$$WB_{min} = \frac{\frac{D_{max} + D_{min}}{2} - d}{2} - \left( \frac{W_{max} - W_{min}}{2} - \frac{D_{max} - D_{min}}{4} \right)$$

9. A method as claimed in claim 5, wherein said cable or wire is twisted clockwise and anticlockwise in relation to a stationary measuring device in order to measure the wall thickness of the insulation coating at the whole circumference of the cable or wire.

10. A method as claimed in claim 3, wherein said external diameter is determined simultaneously on two relatively angularly displaced axes lying in a plane perpendicular to the axis of said cylindrical member.

11. A method as claimed in claim 1, utilizing an apparatus for measuring the wall thickness of said layer, wherein said apparatus is initially calibrated by reference to a standard sample.

12. A measuring apparatus for checking the wall thickness of a surface coating upon a substantially cylindrical member having a known diameter, comprising a first measuring instrument for measuring the maxima and minima of the wall thickness of the surface coating, a second measuring instrument for determining the maxima and minima of the external diameter of the surface coating, and a computer for calculating the eccentricity as a function of the difference between said measured maxima and minima of the wall thickness values and the difference between said measured maxima and minima of the external diameter values, for minimizing the effect of drift and non linearity upon said measured wall thickness values and said external diameter values.

13. An apparatus as claimed in claim 12, further arranged to calculate the minimum wall thickness of the known coating, given the diameter of the cylindrical member.

14. An apparatus as claimed in claim 12, comprising means for transporting an insulated cable past said measuring instruments whereby the conductor of the cable comprises said substantially cylindrical member, and the insulating sheath comprises said surface coating and, preceding the measuring instruments, with reference to the direction of transport, a device for twisting the transported cable to be measured.

15. An apparatus as claimed in claim 12, comprising means for the continued rotation of the measuring instruments clockwise and anticlockwise through at least 360° about the longitudinal axis of the said substantially cylindrical member.

16. An apparatus as claimed in claim 12, comprising a measured-value store for storing measured values associated with given wall thicknesses for the purpose of linearization of the wall-thickness measurement.

* * * * *